US010121750B2

(12) United States Patent
Liu et al.

(10) Patent No.: US 10,121,750 B2
(45) Date of Patent: Nov. 6, 2018

(54) SENSOR CHIP PACKAGE ASSEMBLY AND ELECTRONIC DEVICE HAVING SENSOR CHIP PACKAGE ASSEMBLY

(71) Applicant: Shenzhen Goodix Technology Co., Ltd., Shenzhen (CN)

(72) Inventors: Yuping Liu, Shenzhen (CN); Wei Long, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/611,766

(22) Filed: Jun. 1, 2017

(65) Prior Publication Data

US 2017/0271278 A1 Sep. 21, 2017

Related U.S. Application Data

(63) Continuation of application No. PCT/CN2016/098161, filed on Sep. 6, 2016.

(30) Foreign Application Priority Data

Sep. 11, 2015 (CN) .................... 2015 2 0701432 U (51) Int. Cl.
*H01L 29/84* (2006.01)
*H01L 23/00* (2006.01)
(Continued)

(52) U.S. Cl.
CPC ........ *H01L 23/562* (2013.01); *H01L 21/4825* (2013.01); *H01L 21/4828* (2013.01);
(Continued)

(58) Field of Classification Search
CPC ............. H01L 23/562; H01L 23/49548; H01L 21/4828; H01L 21/4825; H01L 23/3114;
(Continued)

(56) References Cited

U.S. PATENT DOCUMENTS 6,777,265 B2   8/2004  Islam et al.
7,790,500 B2 * 9/2010  Ramos ................... H01L 24/40
                                                      257/676

(Continued)

FOREIGN PATENT DOCUMENTS

CN    1577828 A    2/2005
CN    1735963 A    2/2006
(Continued)

OTHER PUBLICATIONS

International Search Report for International Application No. PCT/CN2016/098161, Applicant: Shenzhen Huiding Technology Co., Ltd., dated Dec. 14, 2016, 2 pages.

*Primary Examiner* — Vu A Vu (57) ABSTRACT

A sensor chip package assembly and an electronic device having the sensor chip package assembly are disclosed, where the sensor chip package assembly includes: a metal substrate (100) which has a bonding pad region (11) and a placement region (12), the bonding pad region having a plurality of metal bonding pads (13); a sensor chip (200) which is located on an upper surface of the metal substrate, and the sensor chip having a plurality of sensor chip bonding pads (21); an electrical connection assembly (300) which electrically connects a metal bonding pad and a sensor chip bonding pad; and a packaging material cover (400) which covers the metal substrate, the sensor chip and the electrical connection assembly, where any two adjacent metal bonding pads are spaced in an insulated manner by the packaging material cover.

18 Claims, 6 Drawing Sheets

(51) Int. Cl.
*H01L 23/488* (2006.01)
*H01L 21/48* (2006.01)
*H01L 21/56* (2006.01)
*H01L 23/31* (2006.01)
*H01L 23/495* (2006.01)

(52) U.S. Cl.
CPC ........ *H01L 21/565* (2013.01); *H01L 23/3107* (2013.01); *H01L 23/3114* (2013.01); *H01L 23/488* (2013.01); *H01L 23/4952* (2013.01); *H01L 23/49503* (2013.01); *H01L 23/49541* (2013.01); *H01L 23/49548* (2013.01); *H01L 23/49582* (2013.01); *H01L 24/13* (2013.01); *H01L 24/16* (2013.01); *H01L 24/45* (2013.01); *H01L 24/48* (2013.01); *H01L 24/05* (2013.01); *H01L 24/49* (2013.01); *H01L 2224/05553* (2013.01); *H01L 2224/13111* (2013.01); *H01L 2224/13144* (2013.01); *H01L 2224/13147* (2013.01); *H01L 2224/16* (2013.01); *H01L 2224/16245* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48095* (2013.01); *H01L 2224/48247* (2013.01); *H01L 2224/48479* (2013.01); *H01L 2224/48499* (2013.01); *H01L 2224/49433* (2013.01); *H01L 2924/10161* (2013.01); *H01L 2924/15747* (2013.01); *H01L 2924/181* (2013.01); *H01L 2924/3511* (2013.01)

(58) Field of Classification Search
CPC ............ H01L 23/49582; H01L 21/565; H01L 23/4952; H01L 23/49503; H01L 24/16; H01L 24/13; H01L 24/48; H01L 24/45; H01L 2224/13111
USPC ........................................................ 257/414
See application file for complete search history.

(56) References Cited

U.S. PATENT DOCUMENTS

| | | | |
|---|---|---|---|
| 7,858,443 | B2 | 12/2010 | Powell et al. |
| 8,143,169 | B2* | 3/2012 | Engel .................... G01D 5/147 |
| | | | 438/123 |
| 8,324,602 | B2* | 12/2012 | Wiese ................... H01L 25/167 |
| | | | 250/239 |
| 2003/0207498 | A1 | 11/2003 | Islam et al. |
| 2005/0001292 | A1 | 1/2005 | Hatauchi |
| 2006/0185452 | A1 | 8/2006 | Shirasaka et al. |
| 2010/0127366 | A1* | 5/2010 | Bond ................. G06K 9/00026 |
| | | | 257/676 |
| 2010/0148330 | A1* | 6/2010 | Ehrenpfordt .......... B81B 7/0054 |
| | | | 257/676 |
| 2010/0224970 | A1 | 9/2010 | Powell et al. |
| 2011/0111562 | A1 | 5/2011 | San Antonio et al. |
| 2011/0156225 | A1* | 6/2011 | Hozoji .................. H01L 21/561 |
| | | | 257/659 |
| 2013/0126988 | A1* | 5/2013 | Lo ........................... H01L 24/97 |
| | | | 257/415 |
| 2013/0256848 | A1 | 10/2013 | Kawabata et al. |
| 2014/0001615 | A1 | 1/2014 | Otremba et al. |
| 2014/0072795 | A1 | 3/2014 | Kim et al. |
| 2014/0264657 | A1* | 9/2014 | Gogoi ..................... H01L 27/14 |
| | | | 257/416 |
| 2015/0001707 | A1 | 1/2015 | Do et al. |
| 2015/0054099 | A1 | 2/2015 | Yow et al. |

FOREIGN PATENT DOCUMENTS

| | | |
|---|---|---|
| CN | 1832158 A | 9/2006 |
| CN | 101834166 A | 9/2010 |
| CN | 204991696 U | 1/2016 |
| CN | 105655302 A | 6/2016 |
| CN | 105789144 A | 7/2016 |
| CN | 205428898 U | 8/2016 |
| JP | 2007294637 A | 11/2007 |
| JP | 2013153005 A | 8/2013 |
| JP | 2013168511 A | 8/2013 |
| JP | 2015159273 A | 9/2015 |
| KR | 20130072735 A | 7/2013 |

* cited by examiner

FIG. 11

SENSOR CHIP PACKAGE ASSEMBLY AND ELECTRONIC DEVICE HAVING SENSOR CHIP PACKAGE ASSEMBLY

CROSS-REFERENCE TO RELATED APPLICATIONS

This application is a continuation of International Application No. PCT/CN2016/098161, filed on Sep. 6, 2016, which claims priority to Chinese Patent Application No. 201520701432.5, filed on Sep. 11, 2015, both of which are hereby incorporated by reference in their entireties

TECHNICAL FIELD

The present application belongs to the electronic field, and specifically, the present application relates to a sensor chip package assembly and an electronic device having the sensor chip package assembly.

BACKGROUND

At present, a mainstream package of biometric recognition mainly adopts a package of a printed circuit board (PCB) substrate type. However, since each development of the package of the PCB substrate type needs to be designed individually and a PCB substrate needs die sinking, it will result in a longer development period and high cost. In addition, the PCB substrate has a hidden trouble of large warpage, thus seriously affecting an operation of a subsequent assembly process. Moreover, since bonding pads are interconnected with each other on the PCB substrate, transmission of electrical signals between a sensor chip and the PCB substrate is interfered with each other, thus affecting accuracy of the signals.

Therefore, the existing sensor chip package assembly needs to be further improved.

SUMMARY

The present application is intended to at least solve one of technical problems in related art to a certain extent. For this purpose, an object of the present application is to provide a sensor chip package assembly and an electronic device having the sensor chip package assembly. The sensor chip package assembly has advantages of a shorter development period and less warpage, thus improving efficiency of subsequent assembly while saving cost. In addition, since a plurality of metal bonding pads are independent from each other on a metal substrate, it may realize independently transmitting a plurality of signals between a sensor chip and the metal substrate, thus dramatically reducing risk of interference among the plurality of signals.

According to one aspect of the present application, the present application provides a sensor chip package assembly. According to an embodiment of the present application, the sensor chip package assembly includes: a metal substrate, the metal substrate having a bonding pad region and a placement region, and the bonding pad region having a plurality of metal bonding pads; a sensor chip, the sensor chip being located on an upper surface of the metal substrate, and the sensor chip having a plurality of sensor chip bonding pads; an electrical connection assembly, the electrical connection assembly electrically connecting a metal bonding pad and a sensor chip bonding pad; and a packaging material cover, the packaging material cover covering the metal substrate, the sensor chip and the electrical connection assembly, and a lower surface of the metal substrate being not covered by the packaging material cover, where any two adjacent metal bonding pads are spaced in an insulated manner by the packaging material cover.

The sensor chip package assembly according to the embodiment of the present application has advantages of a shorter development period and less warpage, thus improving efficiency of subsequent assembly while saving cost. In addition, since a plurality of metal bonding pads are independent from each other on a metal substrate, it may realize independently transmitting a plurality of signals between a sensor chip and the metal substrate, thus dramatically reducing risk of interference among the plurality of signals.

Moreover, the sensor chip package assembly according to the above embodiment of the present application may further have the following additional technical features.

Optionally, the electrical connection assembly is a bonding wire or a metal bump. As such, stable transmission of a signal between a sensor chip and the metal substrate may be realized.

Optionally, the bonding wire is a gold wire, a copper wire, an aluminum wire, or an alloy wire. As such, stable transmission of a signal between the sensor chip and the metal substrate may be further realized.

Optionally, a wire diameter of the boding wire is not less than 15 micrometers. As such, stable transmission of a signal between the sensor chip and the metal substrate may be further realized.

Optionally, the metal bump is a gold bump, a copper bump, or a tin bump. As such, stable transmission of a signal between the sensor chip and the metal substrate may be further realized.

Optionally, shapes of the plurality of metal bonding pads are different. As such, more metal bonding pads may be accommodated according to actual needs.

Optionally, each of the metal bonding pads is formed as circular or polygonal. As such, more metal bonding pads may be accommodated according to actual needs.

Optionally, a dielectric constant of the packaging material cover is greater than 3. As such, an obtained sensor chip package assembly may be enabled to have higher stability.

Optionally, a distance between the sensor chip and the metal bonding pad is greater than 20 micrometers. As such, stability of the obtained sensor chip package assembly may be further improved.

Optionally, the metal substrate is a copper substrate. As such, a degree of warpage of a substrate may be reduced dramatically, thus further improving stability of the obtained sensor chip package assembly.

According to a second aspect of the present application, the present application provides an electronic device. According to an embodiment of the present application, the electronic device includes the above sensor chip package assembly. As such, by using the above sensor chip package assembly, a development period and raw material cost of the electronic device may be dramatically reduced, and stability of transmitting a signal inside the electronic device may be improved significantly at the same time. It should be noted that features and advantages described previously with regard to the sensor chip package assembly are also applicable to the electronic device, which will not be described redundantly herein.

Additional aspects and advantages of the present application will be given partly in the following descriptions, and partly become apparent in the following description or be learned from implementation of the present application.

BRIEF DESCRIPTION OF DRAWINGS

The above and/or additional aspects and advantages of the present application will become apparent and easy to be understood from description of embodiments made with reference to the drawings below, where.

DESCRIPTION OF EMBODIMENTS

Embodiments of the present application will be described in detail below, and examples of the embodiments are shown in the drawings, in which identical or similar reference numbers denote identical or similar elements, or elements with identical or similar functions. The following embodiments described with reference to the drawings are exemplary and intended to be used to explain the present application, and may not be understood as limiting the present application.

In the description of the present application, it should be understood that orientations or positional relationships indicated by terms such as "center", "longitudinal", "crosswise", "length", "width", "thickness", "up", "down", "front", "rear", "left", "right", "vertical", "horizontal", "top", "bottom", "inside", "outside", "clockwise", "anticlockwise", "axial direction", "radial direction" and "circumferential direction" are orientations or positional relationships shown based on the drawings, and the terms are merely for convenience of describing the present application and for simplifying the description, but for indicating or implying that an indicated apparatus or element must have a specific orientation, and must be constructed and operated in a specific orientation, which thus may not be understood as limiting the present application.

Besides, terms "first" and "second" are for a descriptive purpose only, and may not be understood as indicating or implying relative importance, or implicitly indicating the quantity of indicated technical features. As such, features defined with the terms "first" and "second" may explicitly indicate or implicitly include at least one of the features. In the description of the present application, the meaning of "multiple" is at least two, for example, two, three, etc., unless explicitly and specifically defined otherwise.

In the present application, unless explicitly specified and defined otherwise, terms such as "installation", "interconnection", "connection" and "fixation" should be understood broadly, for example, they may either be a fixed connection, or a detachable connection, or integrated; they may either be a mechanical connection, or an electric connection; and they may either be a direct connection, or an indirect connection through an intermediary, and they may be an internal connection between two elements or an interaction relationship between the two elements, unless explicitly defined otherwise. A person of ordinary skill in the art may understand specific meanings of the above terms in the present application according to specific conditions.

In the present application, unless explicitly specified and defined otherwise, a first feature being "on" or "under" a second feature may be that the first feature and the second feature are in direct contact, or the first feature and the second feature are in indirect contact through an intermediary. In addition, the first feature being "on", "over" and "above" the second feature may be that the first feature is just above or diagonally above the second feature, or merely represents that a horizontal height of the first feature is higher than that of the second feature. The first feature being "under", "below" and "underneath" the second feature may be that the first feature is just below or diagonally below the second feature, or merely represents that the horizontal height of the first feature is lower than that of the second feature.

According to one aspect of the present application, the present application provides a sensor chip package assembly. According to an embodiment of the present application, with reference to FIG. 1, the sensor chip package assembly includes: a metal substrate 100, a sensor chip 200, an electrical connection assembly 300 and a packaging material cover 400, where the metal substrate 100 has a bonding pad region 11 and a placement region 12, the bonding pad region 11 having a plurality of metal bonding pads 13; the sensor chip 200 is located on an upper surface of the metal substrate 100, and the sensor chip 200 has a plurality of sensor chip bonding pads 21; the electrical connection assembly 300 electrically connecting a metal bonding pad 13 and a sensor chip bonding pad 21; and the packaging material cover 400 covers the metal substrate 100, the sensor chip 200 and the electrical connection assembly 300, and a lower surface of the metal substrate 100 is not covered by the packaging material cover 400, where any two adjacent metal bonding pads 13 are spaced in an insulated manner by the packaging material cover 400. The inventor finds that, due to features of a short development period and lower cost of a metal substrate, a sensor chip package assembly with the metal substrate replacing a traditional PCB substrate, enables cost of producing the sensor chip package assembly to be saved significantly. Meanwhile, since a coefficient of thermal expansion of the metal substrate is fixed, it may effectively solve a problem that a conventional PCB substrate has large warpage, and may further improve efficiency of subsequent assembly significantly. Moreover, use of the metal substrate makes a direction of selecting resin as a packaging material clearer such that a product may avoid a lot of detours of repeated verification of injection molding, thus further reducing the cost of producing the sensor chip package assembly. In addition, since a plurality of metal bonding pads are independent from each other on the metal substrate, by adopting a metal substrate in a structure of the present application, it may realize independently transmitting a plurality of signals between a sensor chip and the metal substrate, thus dramatically reducing risk of interference among the plurality of signals.

Figure 1:
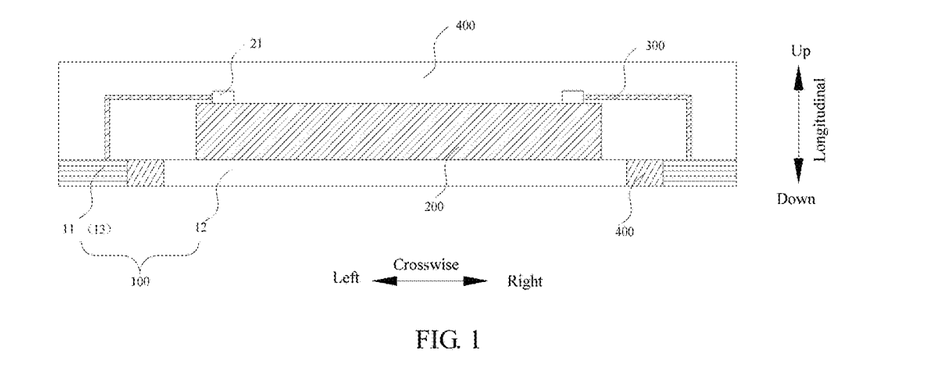
FIG. 1 is a schematic diagram of a longitudinal section of a sensor chip package assembly according to an embodiment of the present application.

According to an embodiment of the present application, the bonding pad region 11 and the placement region 12 on the metal substrate 100 may be two regions independent from each other on the metal substrate, that is, the two regions are not interconnected.

According to another embodiment of the present application, the metal substrate may either be a metal substrate on which a bonding pad region and a placement region are pre-disconnected from each other, or a metal substrate on which a bonding pad region and a placement region are pre-interconnected and subsequently separated from each other by etching. Particularly, no matter the metal substrate on which the bonding pad region and the placement region are pre-disconnected from each other is adopted or the metal substrate on which the bonding pad region and the placement region are pre-interconnected and subsequently separated from each other by etching is adopted, metal bonding pads in the bonding pad region may all be fixed finally with action of a packaging material cover so that a direct connection of a signal between a sensor chip and the metal substrate may be realized, thus effectively avoiding mutual interference of a plurality of signals.

According to yet another embodiment of the present application, a specific type of the metal substrate 100 is not particularly limited, and according to a specific embodiment of the present application, the metal substrate 100 may be a copper substrate. As such, since a copper substrate has a single component as compared with a traditional PCB substrate, by adopting the copper substrate, a coefficient of thermal expansion of the metal substrate is enabled to be relatively fixed, and it may effectively solve a problem that a conventional PCB substrate has large warpage, and may further improve the efficiency of subsequent assembly significantly. Moreover, use of the copper substrate makes a direction of selecting resin as a packaging material clearer than a metal substrate of another type such that a product may avoid a lot of detours of repeated verification of injection molding, thus further reducing the cost of producing the sensor chip package assembly.

A person skilled in the art may understand that a chip or a package assembly is fabricated as a whole strip, that is, respective die chips or package assemblies (hereinafter referred as "die") are connected, and are required to be cut into dies subsequently to continue producing modules. In other words, each kind of package design is a design based on a die, but production is carried out based on joining dies together to form a large board.

For example, the sensor chip package assembly of the embodiments of the present application may be a die sensor chip package assembly after being cut, of which a package design is a design based on a die, but production is carried out based on a large board.

According to yet another embodiment of the present application, a chip holding portion of the metal substrate may adopt a recessed design or a coplanar design, and a position of an output point of a metal bonding pad may be lifted by adopting the recessed design.

Figure 7:
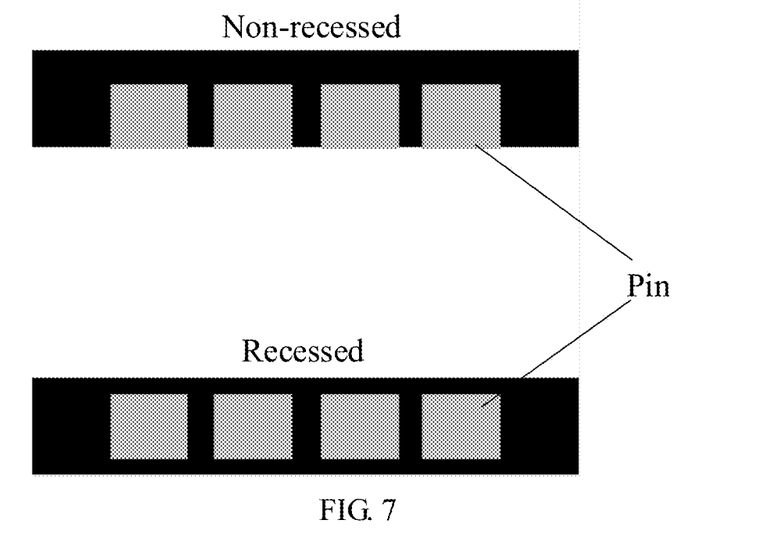
FIG. 7 is a schematic diagram of change in a position of a pin according to an embodiment of the present application.

The chip holding portion refers to a portion on the metal substrate where a chip is placed in a package assembly. The recessed design is that the portion is recessed, which makes the chip shift downward, and thus the position of the output point of the metal bonding pad, i.e., a position of a pin, is lifted. In this way, after a plastic package is completed, there will be an insulation material (as shown in FIG. 7, black parts represent the insulation material) with a certain thickness under the pin, and thus a short circuit is difficult to occur.

It should be understood that the chip holding portion may also be non-recessed, i.e., adopting the coplanar design, which will not be limited in the present application.

According to yet another embodiment of the present application, the chip support portion of the metal substrate may be placed at four corners thereof or be placed among metal bonding pads, or a support point thereof may be added or deleted as required.

Figure 8:
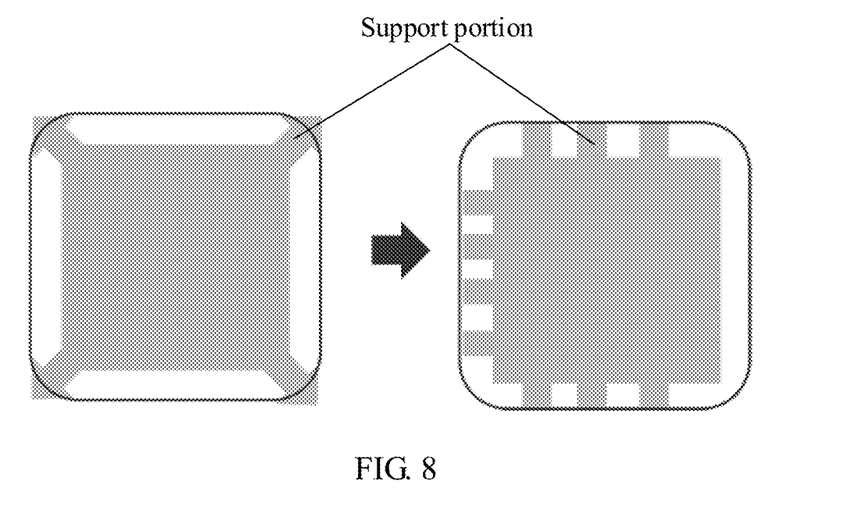
FIG. 8 is a schematic diagram of a chip support portion according to an embodiment of the present application.

The chip support portion is a diepad provided on the metal substrate for supporting a chip. As shown in FIG. 8, the chip support portion may either be placed at four corners of the metal substrate or be placed among the metal bonding pads. The chip support portion being placed among the metal bonding pads is more convenient to be cut.

According to yet another embodiment of the present application, the metal substrate may be a copper substrate or a substrate with tin, silver, etc. plated on a copper base material, and may also be another conductive material, and the present application is not limited to this.

According to yet another embodiment of the present application, the metal substrate adopts half-etching or half-cutting after packaging among dies to realize insulation of different circuits so as to facilitate a latter strip process test, etc.

Specifically, a package assembly is fabricated as a whole strip, and respective dies thereof are connected and cannot be tested, and thus it needs to be separated physically to realize electrical separation. The package assembly needs to be electrically separated, but cannot be cut off by a whole strip because the package assembly cannot be cut into any desired shape by a module factory according to a project requirement if it is cut off. The dies are insulated through electrical separation in a half-etching or half-cutting mode, thereby not disturbing a mutual test.

According to yet another embodiment of the present application, the metal substrate may be a whole strip of substrate with pre-protected terminals, or a layer of metal substrate with coplanar pins formed through electroplating.

Specifically, interconnection setting of the metal substrate may either be preset before an assembly is packaged, or be set after the assembly is packaged. A package manner adopted by a presetting may either be an advanced quad flat no-lead package (aQFN), or be a molded interconnect system (MIS) package.

According to yet another embodiment of the present application, a pin of the metal substrate may be a no-lead bonding pad and terminal, or a protruding pin of a J type, a P type and an N type.

The pin of the metal substrate is connected to the metal bonding pad, and the pin may be package leads corresponding to various package types, for example, it may be a no-lead bonding pad, terminal, or a protruding pin of a J type, P type and N type.

Figure 2:
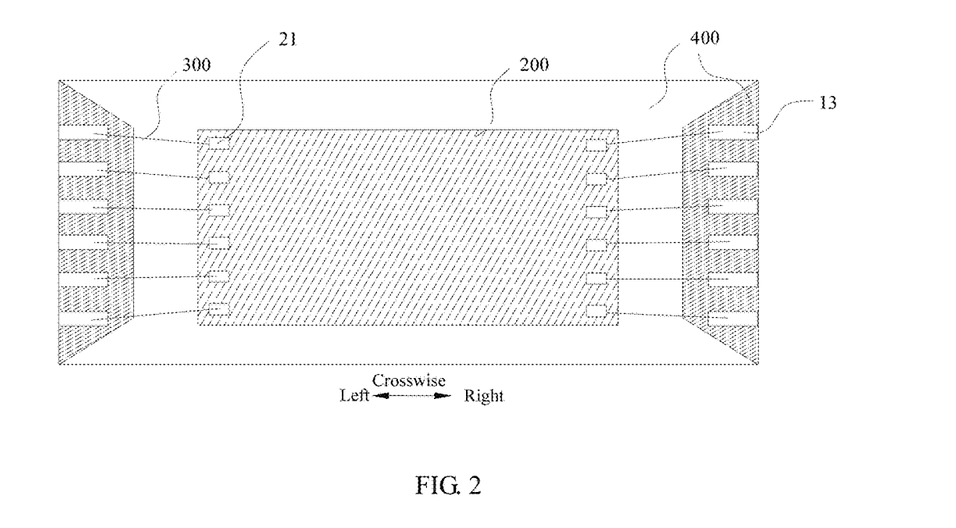
FIG. 2 is a schematic diagram of a cross section of a sensor chip package assembly according to an embodiment of the present application.
Figure 3:
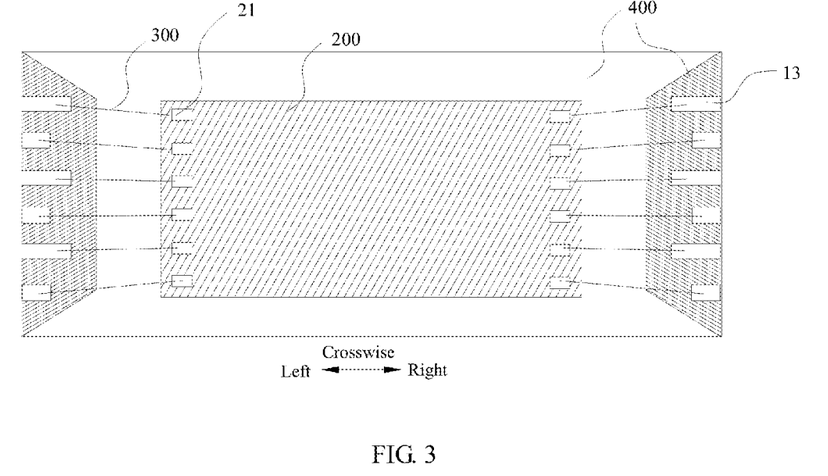
FIG. 3 is a schematic diagram of a cross section of a sensor chip package assembly according to another embodiment of the present application.
Figure 4:
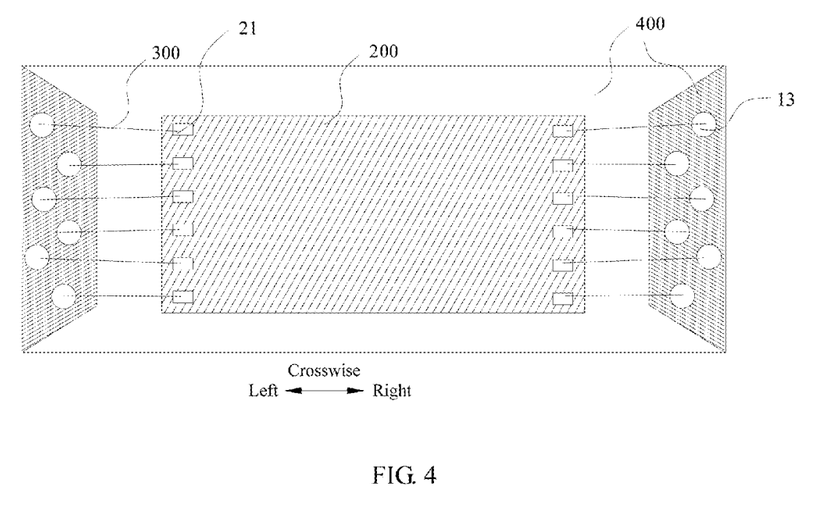
FIG. 4 is a schematic diagram of a cross section of a sensor chip package assembly according to yet another embodiment of the present application.

According to yet another embodiment of the present application, shapes of a plurality of metal bonding pads on the metal substrate may be different, which may be selected by a person skilled in the art according to actual needs. According to a specific embodiment of the present application, the plurality of metal bonding pads may be circular or polygonal, for example, as shown in FIGS. 2-4, the plurality of metal bonding pads may either be strip metal bonding pads in an identical shape and size, or be strip metal bonding pads in an identical shape and different lengths, or be circular metal bonding pads in an identical size, and specifically, a person skilled in the art may make a selection according to actual needs of signal transmission. It should be noted that a person skilled in the art may combine the metal bonding pads in the above three shapes according to actual needs.

According to yet another embodiment of the present application, a laterally exposed size of a metal bonding pad will be reduced between connected dies by adopting designs including surface half-etching, or stereoscopic surface half-etching, or hollowing, but the present application is not limited to this.

Figure 9A:
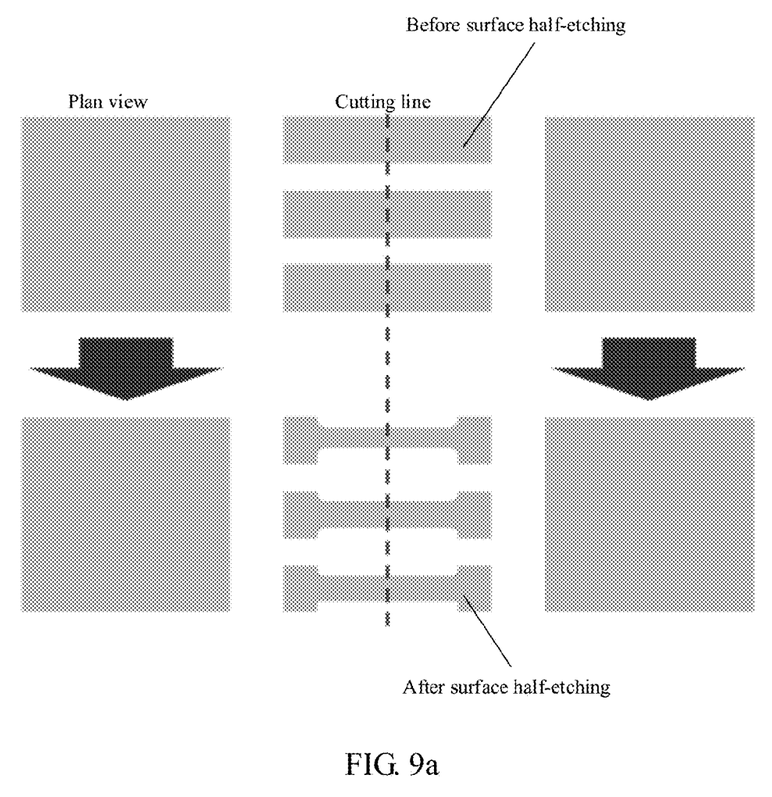
FIG. 9a and FIG. 9b are respectively schematic diagrams of surface half-etching and stereoscopic surface half-etching of a metal bonding pad according to an embodiment of the present application.
Figure 9B:
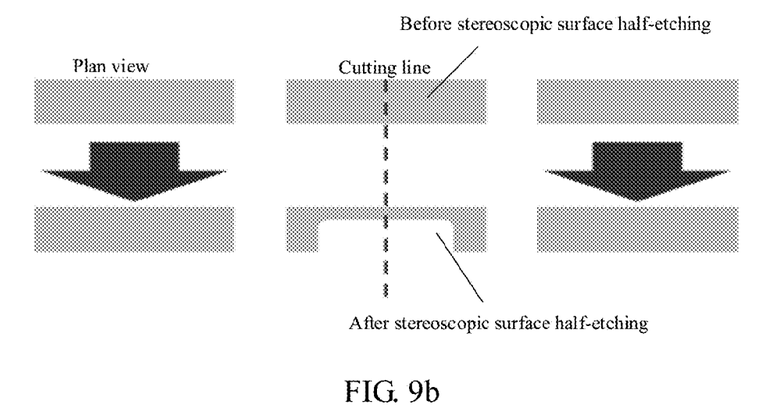

Specifically, each kind of package design is a design based on a die, while production is carried out based on joining dies together to form a large board. Large board imposition needs to make an interconnection design among dies to reduce an interconnection area, thickness, size, etc. among the dies as much as possible so as to contribute to subsequent electrical separation, electro-static discharge (ESD), etc. Etching and hollowing may be designed for a whole leadframe, where the hollowing design is that hollowness spreads all over an ordinary leadframe, the surface half-etching is as shown in FIG. 9a, and the stereoscopic surface half-etching is as shown in FIG. 9b.

According to yet another embodiment of the present application, a specific type of the sensor chip 200 is not particularly limited, which may be selected by a person skilled in the art according to actual needs. According to a specific embodiment of the present application, the sensor chip 200 may be a capacitive sensor chip. Specifically, the sensor chip has an integrated circuit, and when being powered on, the integrated circuit may generate a signal, and realize a function of a certain purpose.

According to yet another embodiment of the present application, the sensor chip bonding pads 21 on the sensor chip 200 correspond to the metal bonding pads 13 one to one so that independent transmission of a plurality of signals between the sensor chip and the metal substrate may be realized, thus reducing mutual interference among the plurality of signals.

Figure 5:
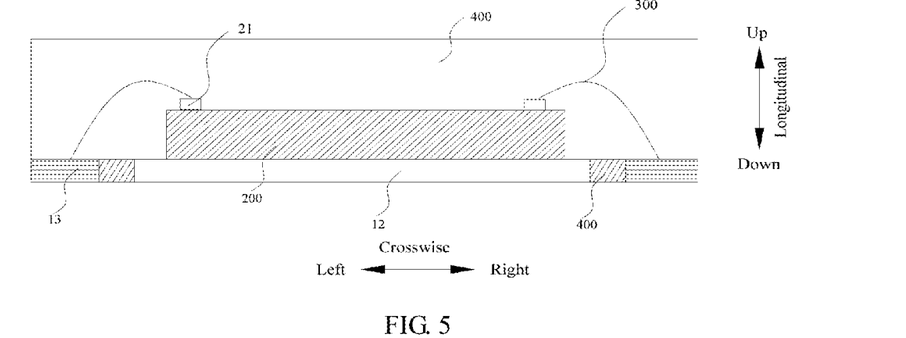
FIG. 5 is a schematic diagram of a longitudinal section of a sensor chip package assembly according to another embodiment of the present application.
Figure 6:
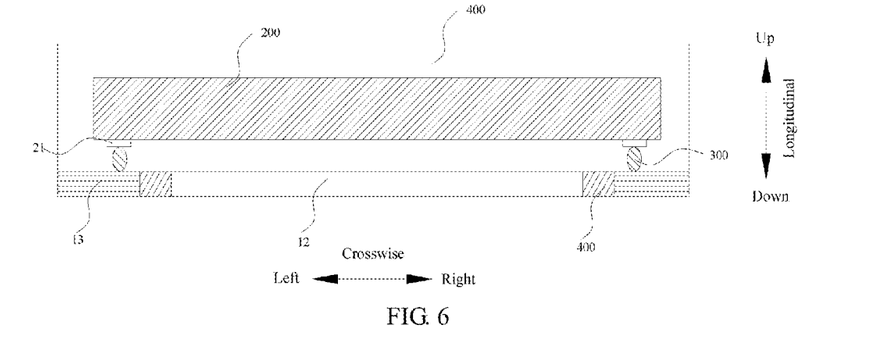
FIG. 6 is a schematic diagram of a longitudinal section of a sensor chip package assembly according to yet another embodiment of the present application.

According to yet another embodiment of the present application, a specific type of the electrical connection assembly 300 is not particularly limited, which may be selected by a person skilled in the art according to actual needs. According to a specific embodiment of the present application, the electrical connection assembly 300 may be a bonding wire or a metal bump. According to a specific example of the present application, as shown in FIG. 5, the electrical connection assembly 300 is a bonding wire, and the sensor chip 200 is located on an upper surface of the placement region 12 of the metal substrate 100, where the bonding wire electrically connects the sensor chip bonding pad and the metal bonding pad so that transmission of signal between the sensor chip and the metal substrate may be realized. According to another specific example of the present application, as shown in FIG. 6, the electrical connection assembly 300 is a metal bump, and the sensor chip 200 is located on the metal substrate 100, where the sensor chip 200 is fixed by the metal bump on the metal substrate 100, and the metal bump electrically connects the sensor chip bonding pad and the metal bonding pad so that transmission of the signal between the sensor chip and the metal substrate may be realized.

According to yet another embodiment of the present application, a specific type of the bonding wire is not particularly limited, which may be selected by a person skilled in the art according to actual needs. According to a specific embodiment of the present application, the bonding wire may be a gold wire, a copper wire, an aluminum wire, or an alloy wire. As such, since this type of wire has lower resistance, it may significantly improve stable transmission of the signal between the sensor chip and the metal substrate.

According to yet another embodiment of the present application, a wire diameter of the bonding wire is not particularly limited, which may be selected by a person skilled in the art according to actual needs. According to a specific embodiment of the present application, a particle diameter of the bonding wire may be not less than 15 micrometers. The inventor finds that, if the wire diameter of the bonding wire is less than 15 micrometers, an obtained bonding wire is subject to lying on an edge of a chip due to less wire tension, thus resulting in a short circuit of the chip.

According to yet another embodiment of the present application, a specific type of the metal bump is not particularly limited, which may be selected by a person skilled in the art according to actual needs. According to a specific embodiment of the present application, the metal bump may be a gold bump, a copper bump, or a tin bump. As such, stability of transmitting the signal between the sensor chip and the metal substrate may be further improved.

According to yet another embodiment of the present application, a specific type of the packaging material cover 400 is not particularly limited, which may be selected by a person skilled in the art according to actual needs. According to a specific embodiment of the present application, the packaging material cover may be an assembly formed by a material of which a dielectric constant is greater than 3. According to a specific embodiment of the present application, the packaging material cover may be made of epoxy resin. The inventor finds that, this type of packaging material has good chemical stability, good thermal conductivity and a small coefficient of thermal expansion, and also possesses characteristics of better mechanical strength, ease in fabrication, a low price and ease in automatic production, and therefore selecting this type of packaging material may further improve stability and reliability of a sensor chip package assembly.

According to yet another embodiment of the present application, a distance between the sensor chip and the metal bonding pad is not particularly limited, which may be selected by a person skilled in the art according to actual needs. According to a specific embodiment of the present application, the distance between the sensor chip and the metal bonding pad may be greater than 20 micrometers. The inventor finds that, technically, with regard to a manner of a bonding wire, the bonding wire needs igniting a ball, a wire diameter is greater than 15 micrometers, and a solder ball and a chip have thicknesses per se, of which a total thickness will be greater than 20 micrometers, the distance between the sensor chip and the metal bonding pad that is less than 20 micrometers will result in an insufficient remaining connection distance of a ball neck; and with regard to a manner of a metal bump, a height of the metal bump itself is usually higher than 20 micrometers. To sum up, if a distance between a sensor chip and a metal bonding pad is less than 20 micrometers, there will exist difficulty in a connection between the chip and the metal bonding pad.

According to yet another embodiment of the present application, the packaging material cover may either completely cover an upper surface of the sensor chip, or merely cover the periphery of the sensor chip with the upper surface thereof being exposed, and a person skilled in the art may select a specific structure according to actual needs.

According to yet another embodiment of the present application, a layer of another cover with good insulativity may be covered on the packaging material cover after die cutting is completed so as to enhance antistatic protection of a laterally exposed metal bonding pad.

A package assembly is always manufactured as a whole strip, and is required to be cut into dies subsequently to continue producing modules. A material of the other cover with good insulativity may be an insulation material in a resin type, which will not be limited in the present application.

Figure 10:
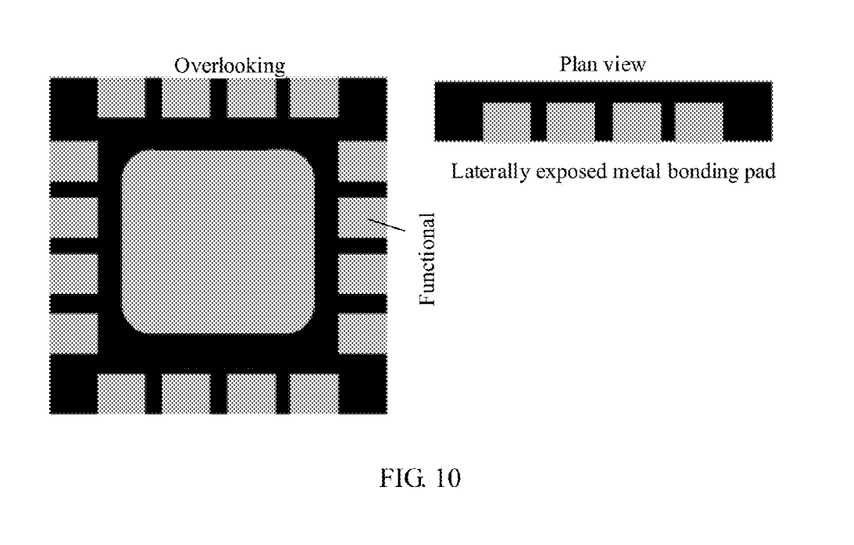
FIG. 10 is a schematic diagram of a laterally exposed metal bonding pad according to an embodiment of the present application.

A schematic diagram of the laterally exposed metal bonding pad is shown in FIG. 10, where an upper surface thereof is functional (i.e., being related to a function of a chip) and needs to be protected using an insulation material, and thus static electricity cannot be discharged through the upper surface; and other surfaces is nonfunctional, and thus the static electricity may be introduced to the ground through another surface. The upper surface may be protected by covering the layer of another cover with good insulativity on the packaging material cover.

According to yet another embodiment of the present application, the other cover contains a metal particle of which a volume proportion may be less than 8%, and the metal particle is of a wrapped type or a non-wrapped type.

Specifically, in order to maintain a minimum color difference with a metal casing, a metal particle (metal power) may be added into a cover. An ordinary metal particle is an ordinary crushed small particle. A particle of a wrapped type refers to a particle obtained by crushing a sandwich folded structure formed by plating a layer of metal film and a layer of resin on a resin film, and a purpose of adopting the particle is to reduce a conductive probability without reducing metal luster. With respect to the particle of the wrapped type, the previous ordinary particle is called a particle of a non-wrapped type.

According to yet another embodiment of the present application, a specific area of the packaging material cover may be printed with a word, for example, product traceability information is marked by means of a laser or printing ink.

For example, the specific area may be a gap region between the sensor chip and the metal bonding pad.

According to yet another embodiment of the present application, the packaging material cover and the metal substrate adopt a fillet or chamfer design before being cut into dies, i.e., reserving a fillet or a chamfer, but the present application is not limited to this.

For example, as shown in FIG. 8, in order to facilitate cutting a die assembly into a fillet or chamfer shape, the packaging material cover and the metal substrate may be reserved with a fillet or a chamfer thereon before being cut into dies.

According to yet another embodiment of the present application, the packaging material cover may be a stereoscopic special-shaped structure.

Specifically, the stereoscopic special-shaped structure refers to that a surface is raised or recessed, and the surface may be raised or recessed partly or regionally.

Figure 11:
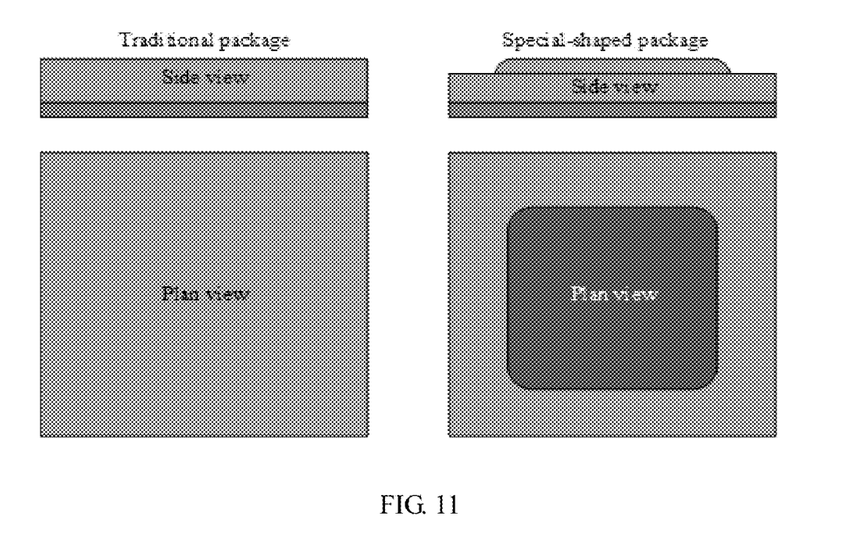
FIG. 11 is a schematic diagram of a special-shaped structure of a packaging material cover according to an embodiment of the present application.

For example, as shown in FIG. 11, the left one is a traditional structure which is not special-shaped, and the right one is a special-shaped structure.

According to yet another embodiment of the present application, a color of the packaging material cover includes black, gray, etc., but it is not limited to this.

According to yet another embodiment of the present application, the packaging material cover may be achieved by polishing a transfer mold with thickened material spacing, or achieved using a thinner compression mold so as to facilitate reducing situation of an inner aperture and being not filled to the brim to a minimum.

Generally, injection molding has situation of an aperture and being not filled to the brim on a micro level. Internal air is discharged through an air drain, sometimes an injection molding flow quickly blocks the air drain, and thus the air has no discharge path, which causes the situation of the aperture and being not filled to the brim. In this case, a flow direction of a molding flow cannot be controlled inside a mold, and the air drain may only be positioned at an edge, a corner and a bottom edge so as to avoid an influence on product appearance by overflow of the air drain.

A packaging (plastic packaging) material is pressurized to change from a solid state to a liquid state, and similar to a mud-rock flow, it includes a large quantity of filling particles (like rocks in the mud-rock flow). If a reserved gap between a surface of a chip and a mold is too small, it will cause that these filling particles are jammed in a casing, and the molding flow cannot flow through, failing to fill the mold. However, if the reserved gap is very large, it will cause that a cover material on the surface of the chip is too thick, thus affecting penetrability of the chip. Therefore, polishing a mold after thickening it may not only solve a penetrability problem, but also solve a problem of defects such as being not filled to the brim. Besides, it may be achieved using a thinner compression mold, which will not be limited in the present application.

According to yet another embodiment of the present application, a material filling particle of the packaging material cover should be as small as possible, and a typical value of a diameter thereof is less than or equal to 40 um. Filling particles with good fluidity are dispersed uniformly, and not easy to aggregate to form partial concentration of large particles.

According to yet another embodiment of the present application, a surface of the sensor chip contains a passivation layer, and a thickness of the passivation layer is more than 10 nanometers, and a color of the passivation layer may either be in black or another color, or transparent.

According to yet another embodiment of the present application, a sensor chip may be interconnected with another chip through a wire in a through-silicon via, an edge chamfer or a backside bevel edge chamfer.

For example, the other chip may be a control chip, a memory chip, etc. In the embodiment of the present application, the above manners are adopted to perform an interconnection so as to avoid using a bonding wire to perform the interconnection.

According to yet another embodiment of the present application, the sensor chip may be a separate sensor chip, or another memory chip or a processor chip including the sensor chip, etc.

To facilitate understanding, a method for producing the sensor chip package assembly of the embodiments of the present application will be described below in detail. The following takes an electrical connection member being a bonding wire and a metal substrate being a complete substrate as examples.

Firstly, an adhesive is coated in a placement region of a metal substrate so as to form an adhesive layer in the placement region of the metal substrate. A person skilled in the art may select a type of an adopted adhesive and a thickness of the adhesive layer according to actual needs. Secondly, a sensor chip is placed on the adhesive layer so as to make the sensor chip fixed on an upper surface of the placement region of the metal substrate, and a bonding wire is adopted to realize electrically connecting a sensor chip bonding pad and a metal bonding pad. Then an obtained assembly is placed in a mold, an upper portion of the mold being higher than an upper surface of the sensor chip, and a liquid packaging material is filled into the mold. A person skilled in the art may adjust conditions such as a filling quantity, filling pressure, and a temperature of the liquid packaging material according to actual needs. Then an obtained chip assembly filled with the packaging material is solidified. Those skilled in the art may adjust conditions such as a solidification time, a solidification temperature and solidification pressure according to actual needs. Lastly, the metal substrate is etched along an edge of a bonding pad region so as to make the bonding pad region disconnected from the placement region, and a plurality of metal bonding pads are spaced from each other. Since a packaging material exists among the plurality of metal bonding pads, the above sensor chip package assembly may be obtained. When the bonding pad region is cut off, a separate metal bonding pad may be intact fixed by a packaging material cover without falling off so that security of using a package may be guaranteed.

According to a second aspect of the present application, the present application provides an electronic device. According to an embodiment of the present application, the electronic device includes the above sensor chip package assembly. As such, by using the above sensor chip package assembly, a development period and raw material cost of the electronic device may be dramatically reduced, and stability of transmitting a signal inside the electronic device may be improved significantly at the same time. It should be noted that features and advantages described previously with regard to the sensor chip package assembly are also applicable to the electronic device, which will not be described redundantly herein.

In the illustrations of the present description, descriptions given with reference to terms such as "an embodiment", "some embodiments", "an example", "a specific embodiment" or "some examples" means that a specific characteristic, structure, material or feature described with reference to the embodiment or example are included in at least one embodiment or example of the present application. In the present description, exemplary statements of the above terms are not required to direct at an identical embodiment or example. Furthermore, the described specific characteristic, structure, material or feature may be combined in a suitable manner in any one or more embodiments or examples. In addition, in a non-contradictory situation, a person skilled in the art may combine different embodiments or examples described in the present description and a characteristic of the different embodiments or examples.

Although embodiments of the present application have been described and illustrated above, it may be understood that the above embodiments are exemplary and may not be understood as limiting the present application, and a person of ordinary skill in the art may make changes, modifications, substitutions and variations to the above embodiments within the scope of the present application.

What is claimed is:

1. A sensor chip package assembly, comprising:
   a metal substrate having a bonding pad region and a placement region, wherein the bonding pad region having a plurality of metal bonding pads;
   a sensor chip being located on an upper surface of the metal substrate, wherein the sensor chip having a plurality of sensor chip bonding pads;
   an electrical connection assembly electrically connecting a metal bonding pad and a sensor chip bonding pad;
   a packaging material cover covering the metal substrate, the sensor chip and the electrical connection assembly, wherein a lower surface of the metal substrate is not covered by the packaging material cover, and any two adjacent metal bonding pads are spaced in an insulated manner by the packaging material cover; and
   an insulated cover on the packaging material cover, wherein the insulated cover comprises a metal particle, wherein a volume proportion of the metal particle in the insulated cover is less than 8%.

2. The sensor chip package assembly according to claim 1, wherein the electrical connection assembly is a bonding wire or a metal bump.

3. The sensor chip package assembly according to claim 1, wherein shapes of the plurality of metal bonding pads are different.

4. The sensor chip package assembly according to claim 1, wherein the metal bonding pad adopts a half-etching or a hollowing design.

5. The sensor chip package assembly according to claim 1, wherein the metal substrate is provided with a chip holding portion, the chip holding portion of the metal substrate adopting a recessed design or a coplanar design.

6. The sensor chip package assembly according to claim 1, wherein the metal substrate is provided with a chip support portion, the chip support portion of the metal substrate being placed at four corners of the metal substrate or being placed among the plurality of metal bonding pads.

7. The sensor chip package assembly according to claim 1, wherein the metal substrate is a copper substrate, a substrate with tin or silver plated on a copper base material.

8. The sensor chip package assembly according to claim 1, wherein the metal substrate adopts half-etching or half-cutting after packaging among dies to realize circuit insulation among different dies.

9. The sensor chip package assembly according to claim 1, wherein the metal substrate is provided with a pin, the pin of the metal substrate is a no-lead bonding pad or terminal, or a protruding pin of a J type, a P type or an N type.

10. The sensor chip package assembly according to claim 1, wherein a dielectric constant of the packaging material cover is greater than 3.

11. The sensor chip package assembly according to claim 1, wherein the metal particle is of a wrapped type or a non-wrapped type.

12. The sensor chip package assembly according to claim 1, wherein a diameter of a material filling particle of the packaging material cover is less than or equal to 40 um.

13. The sensor chip package assembly according to claim 1, wherein a distance between the sensor chip and the metal bonding pad is greater than 20 micrometers.

14. The sensor chip package assembly according to claim 1, wherein a surface of the sensor chip comprises a passivation layer.

15. The sensor chip package assembly according to claim 14, wherein a thickness of the passivation layer is more than 10 nanometers.

16. The sensor chip package assembly according to claim 1, wherein the sensor chip is interconnected with another chip through a wire in a through-silicon via, an edge chamfer or a backside bevel edge chamfer.

17. An electronic device, comprising a sensor chip package assembly, wherein the sensor chip package assembly comprises:
- a metal substrate having a bonding pad region and a placement region, wherein the bonding pad region having a plurality of metal bonding pads;
- a sensor chip being located on an upper surface of the metal substrate, wherein the sensor chip having a plurality of sensor chip bonding pads;
- an electrical connection assembly electrically connecting a metal bonding pad and a sensor chip bonding pad;
- a packaging material cover covering the metal substrate, the sensor chip and the electrical connection assembly, wherein a lower surface of the metal substrate is not covered by the packaging material cover, and any two adjacent metal bonding pads are spaced in an insulated manner by the packaging material cover; and
- an insulated cover on the packaging material cover, wherein the insulated cover comprises a metal particle, wherein a volume proportion of the metal particle in the insulated cover is less than 8%.

18. A method for producing a sensor chip package, comprising:
- coating an adhesive in a placement region of a metal substrate to form an adhesive layer in the placement region of the metal substrate;
- placing a sensor chip on the adhesive layer to make the sensor chip fixed on an upper surface of the placement region of the metal substrate;
- electrically connecting a sensor chip bonding pad with a metal bonding pad;
- placing an obtained assembly in a mold, an upper portion of the mold being higher than an upper surface of the sensor chip, and filling a liquid packaging material into the mold;
- solidifying an obtained chip assembly filled with the packaging material;
- etching the metal substrate along an edge of a bonding pad region to make the bonding pad region disconnected from the placement region; and
- covering an insulated cover on the packaging material, wherein the insulated cover comprises a metal particle, wherein a volume proportion of the metal particle in the insulated cover is less than 8%.

* * * * *